US006661696B2

United States Patent
Schwartz et al.

(10) Patent No.: US 6,661,696 B2
(45) Date of Patent: *Dec. 9, 2003

(54) FERROELECTRIC RANDOM ACCESS MEMORY CONFIGURABLE OUTPUT DRIVER CIRCUIT

(75) Inventors: Kurt Schwartz, Woodland Park, CO (US); Michael Alwais, Newbury Park, CA (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/233,276

(22) Filed: Aug. 28, 2002

(65) Prior Publication Data

US 2003/0048654 A1 Mar. 13, 2003

Related U.S. Application Data

(63) Continuation of application No. 09/950,560, filed on Sep. 10, 2001, now Pat. No. 6,445,608.

(51) Int. Cl.[7] .............................................. G11C 11/22
(52) U.S. Cl. ................................... 365/145; 365/189.05
(58) Field of Search ............................ 365/145, 189.05; 326/85

(56) References Cited

U.S. PATENT DOCUMENTS

| 5,016,217 | A | | 5/1991 | Brahmbhatt |
| 5,811,997 | A | | 9/1998 | Chengson et al. |
| 5,828,596 | A | | 10/1998 | Takata et al. |
| 5,903,500 | A | | 5/1999 | Tsang et al. |
| 6,292,409 | B1 | * | 9/2001 | Smith ..................... 365/189.11 |
| 2002/0181577 | A1 | * | 12/2002 | Bowling ..................... 375/238 |

* cited by examiner

*Primary Examiner*—Huan Hoang
(74) *Attorney, Agent, or Firm*—Hogan & Hartson L.L.P.

(57) ABSTRACT

A FRAM configurable output driver circuit allows the user to configure the output driver for either CMOS level push/pull operation or true open drain operation. This configuration is stored in a non-volatile memory including a FRAM cell and a standard logic latch. The configuration data is restored to the latch on powerup. The user is able to change the configuration at any time. Any changes to the configuration are stored in the non-volatile memory.

12 Claims, 6 Drawing Sheets

PUSH/PULL MODE, OUTPUT HIGH

PUSH/PULL MODE, OUTPUT LOW

US 6,661,696 B2

FERROELECTRIC RANDOM ACCESS MEMORY CONFIGURABLE OUTPUT DRIVER CIRCUIT

RELATED APPLICATION

The present invention is a continuation of U.S. patent application Ser. No. 09/950,560 entitled FERROELECTRIC RANDOM ACCESS MEMORY CONFIGURABLE OUTPUT DRIVER CIRCUIT filed on Sep. 10, 2001, to grant Sep. 3, 2002 as U.S. Pat. No. 6,445,608, which is incorporated herein in its entirety by reference.

BACKGROUND OF THE INVENTION

The present invention is related to output driver circuits, and, more particularly, to a circuit and method for providing a true open drain output driver and a push/pull output driver that is easily configurable by a user command signal.

Typically, two different versions of a CMOS integrated circuit are available, one with push/pull outputs and the other with open drain outputs. Referring now to FIG. 1, a CMOS push/pull output driver 10 for an integrated circuit includes an input node 12, an output pad 14, an N-channel pull-down transistor MN1 and a P-channel pull-up transistor MP1. The current paths of transistors MN1 and MP1 are coupled together at output pad 14 and between the VDD power supply and ground. The output signal at pad 14 is inverted from the polarity of the input signal at node 12.

Referring now to FIG. 2, an NMOS open drain output driver 20 is shown having an external pull-up resistor 16 coupled to an external power supply VEXT. The NMOS open drain output driver 20 for an integrated circuit includes an input node 12, an output pad 14, and only the N-channel pull-down transistor MN1. The current paths of transistor MN1 and resistor 16 are coupled together at output pad 14 and between the VEXT power supply and ground.

The standard CMOS push/pull driver circuit 10 must have the PMOS pull-up transistor MP1 disconnected to prevent forward biasing of the P-MOS well (not shown in FIG. 1) and associated leakage current if the external pull-up voltage exceeds VDD+$V_{BE}$ (wherein $V_{BE}$ is a diode threshold voltage). A true open drain output should not be dependent on the device's supply voltage. Therefore, integrated circuits are typically provided in either of the two driver options discussed above. These two driver options are usually based on a common circuit that is configured at the factory with either a metal mask option or a programmable fuse and does not allow the user to configure the output type.

A prior art user-configurable output circuit 30 that does provide both types of output driver is shown in FIG. 3. Output driver circuit 30 includes an input node 32 and a control signal node 34 coupled to a control logic circuit 36. In turn, the control logic circuit 36 provides logic signals to the gates of transistors MP1 and MN1. The logic conditions for driving the output is shown in table 38 in which the data output state is controlled by input node 32 (IN) and the type of output configuration desired is controlled by the control signal node 34 (PP). Note that a logic high on node 32 and a logic low on node 34 produces a "HiZ" high impedance output since both transistors MN1 and MP1 are turned off.

The configurability provided by circuit 30 shown in FIG. 3 is volatile and has to be reconfigured by the user after powerup since the data state in the control logic circuit 36 is destroyed every time power is removed. Further, as with the standard push/pull output driver configuration described above, the N-well (not shown in FIG. 3) is forward biased once the external pull-up voltage exceeds VDD.

Therefore, in the prior art, separate devices with different mask configurations are required to completely detach the P-channel from the output driver to provide a true open drain output. Alternatively, a configurable circuit provides both types of output circuits, but the output circuit configurability is volatile and there are restrictions on the allowable external voltage coupled to the pull-up resistor.

What is desired, therefore, is a non-volatile, configurable output driver circuit that can provide both a push/pull output and a true open drain output.

SUMMARY OF THE INVENTION

According to the present invention, a FRAM configurable output driver circuit has an output stage that uses two stacked P-channel transistors in series for the pull-up device and a standard N-channel transistor pull-down device. The two stacked P-channel transistors have individual N-type wells with the source of a first P-channel transistor tied to the VDD power supply voltage and the source of a second P-channel transistor tied to the output pad. When the output drives high in push/pull mode, both P-channel output transistor are conducting and the output pad can be driven high. When the output driver drives low in either the push/pull or open drain modes, the first and second P-channel transistors are both turned off, and the output pad can be driven low. In the open drain mode, when the input is high, the output pad is tri-stated, and the output pad is pulled high by an external pull-up device. The second P-channel transistor remains off regardless of the output pad voltage. If the external pullup voltage exceeds VDD, there is no leakage current through the output pad node, because the N-well of the second P-channel transistor is connected to the pad, which is identical to the operation of a true open drain mode output driver circuit. Control signals to the output transistors are set to prevent crowbar current. Non-volatile control logic is used to set either the push/pull or open drain mode configuration.

It is an advantage of the present invention that it is user configurable as a push/pull or open drain output driver.

It is a further advantage of the output driver of the present invention that there is a significant cost, time, and flexibility advantage with this design.

It is a further advantage of the output driver of the present invention that the output driver configuration is stored in non-volatile ferroelectric random-access memory and can be changed at any time by the end user.

It is a further advantage of the output driver of the present invention that the configuration is persistently stored and the data retained even after a loss of power.

The foregoing and other objects, features and advantages of the invention will become more readily apparent from the following detailed description of a preferred embodiment of the invention, which proceeds with reference to the accompanying drawings.

DETAILED DESCRIPTION

Figure 1:
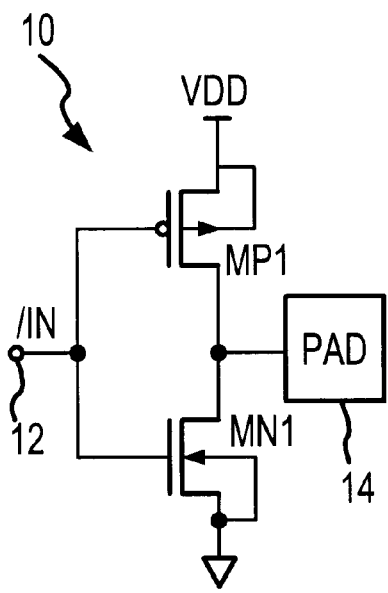
FIG. 1 is a schematic diagram of a prior art CMOS push/pull output driver circuit.
Figure 2:
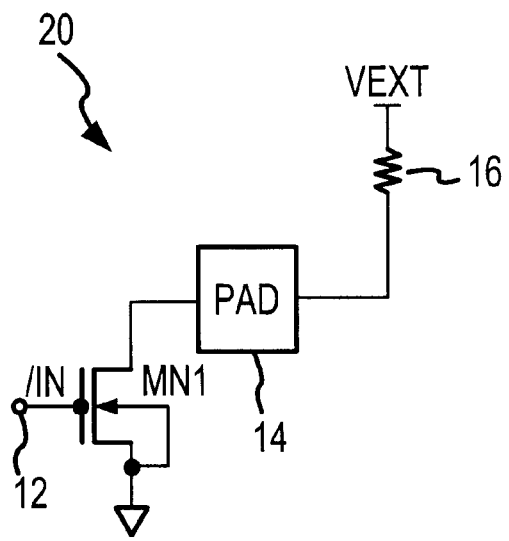
FIG. 2 is a schematic diagram of a prior art NMOS open drain output driver circuit having an external pullup resistor and supply.
Figure 3:
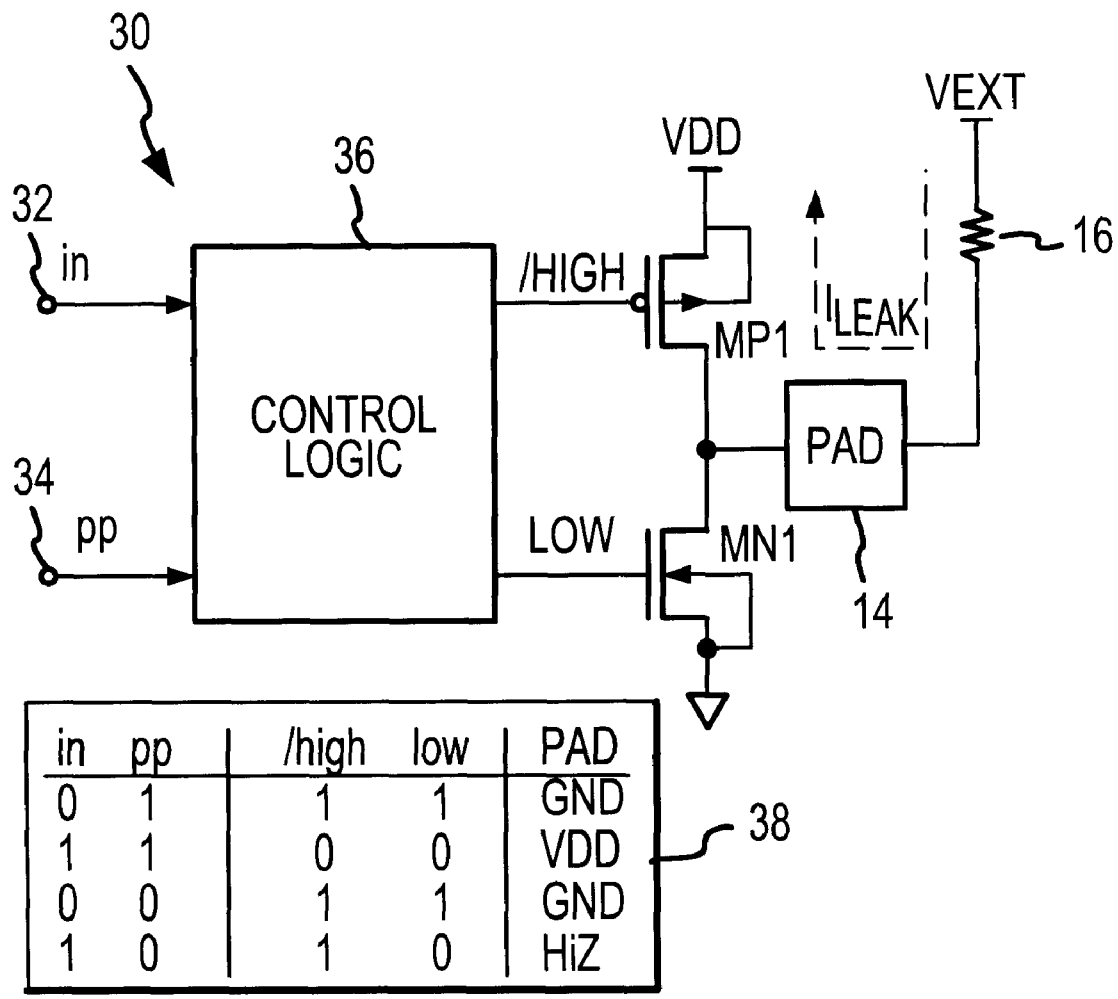
FIG. 3 is a schematic diagram of a prior art configurable output driver circuit.
Figure 4A:
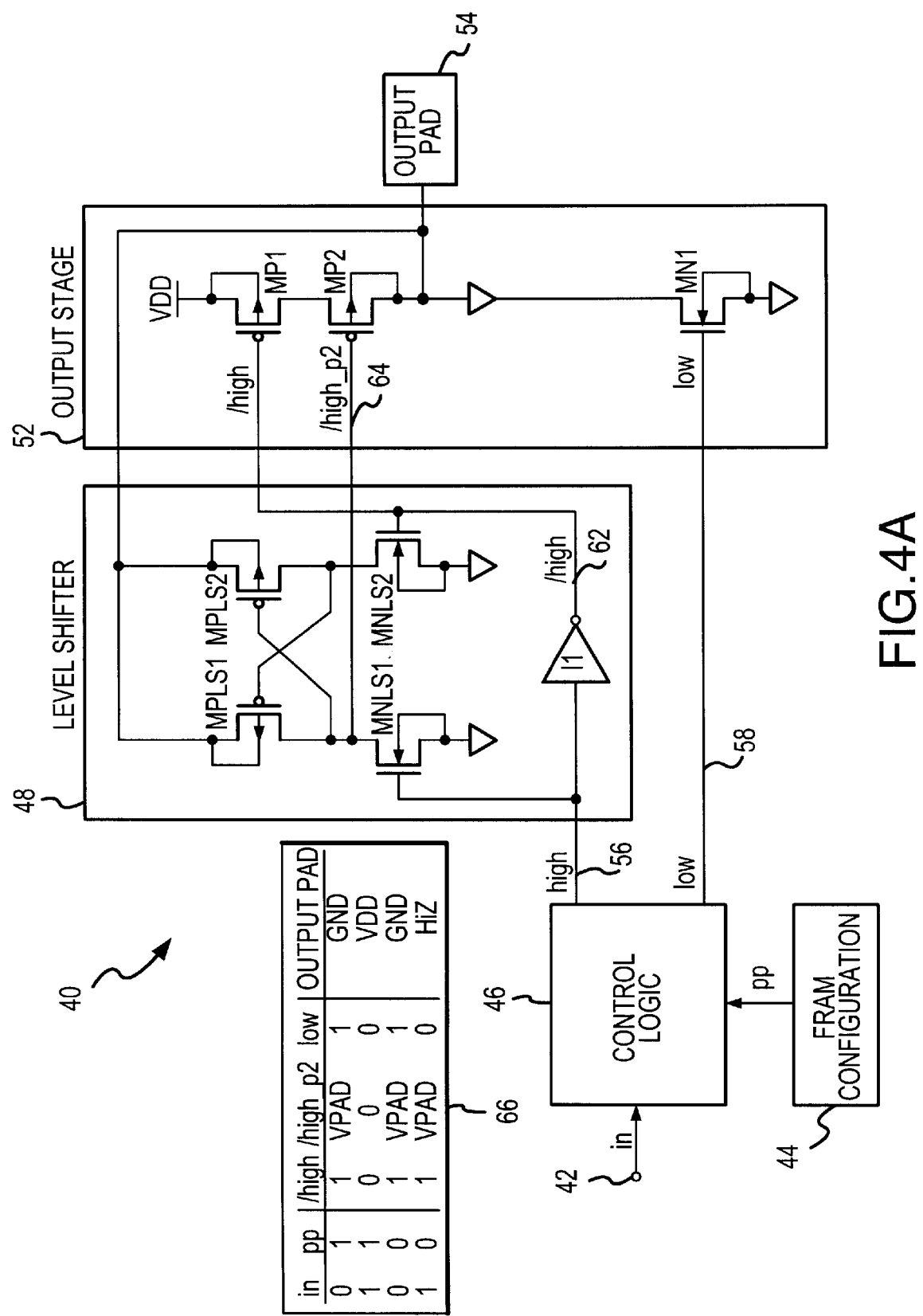
FIG. 4A is a schematic of a non-volatile, configurable output driver circuit according to the present invention having a push/pull output mode and a true open drain output mode.

Referring now to FIG. 4A, a non-volatile configurable output circuit driver circuit 40 includes a non-volatile memory 44 for storing user-selectable output circuit configuration data, a CMOS output stage 52 coupled to an output pad 54, and a control logic circuit 46 coupled to the CMOS output stage 52. The control logic circuit 46 receives an input signal and the circuit configuration data. The output driver circuit 40 also includes circuitry for controlling the voltage across the CMOS output stage 53 to substantially minimize leakage current flow through the output pad 54 as is described in further detail below.

The non-volatile memory 44 is ideally a ferroelectric random-access memory of the type manufactured by the assignee of the present invention, Ramtron International Corporation, of Colorado Springs, Colo. Either a one-transistor, one capacitor ("1T-1C") ferroelectric memory cell-based memory as shown, or a two-transistor, two-capacitor ("2T-2C") ferroelectric memory cell-based memory can be used. A 2T-2C memory cell uses two of the depicted 1T-1C memory cells to store a one-bit data state as complementary data.

Figure 4B:
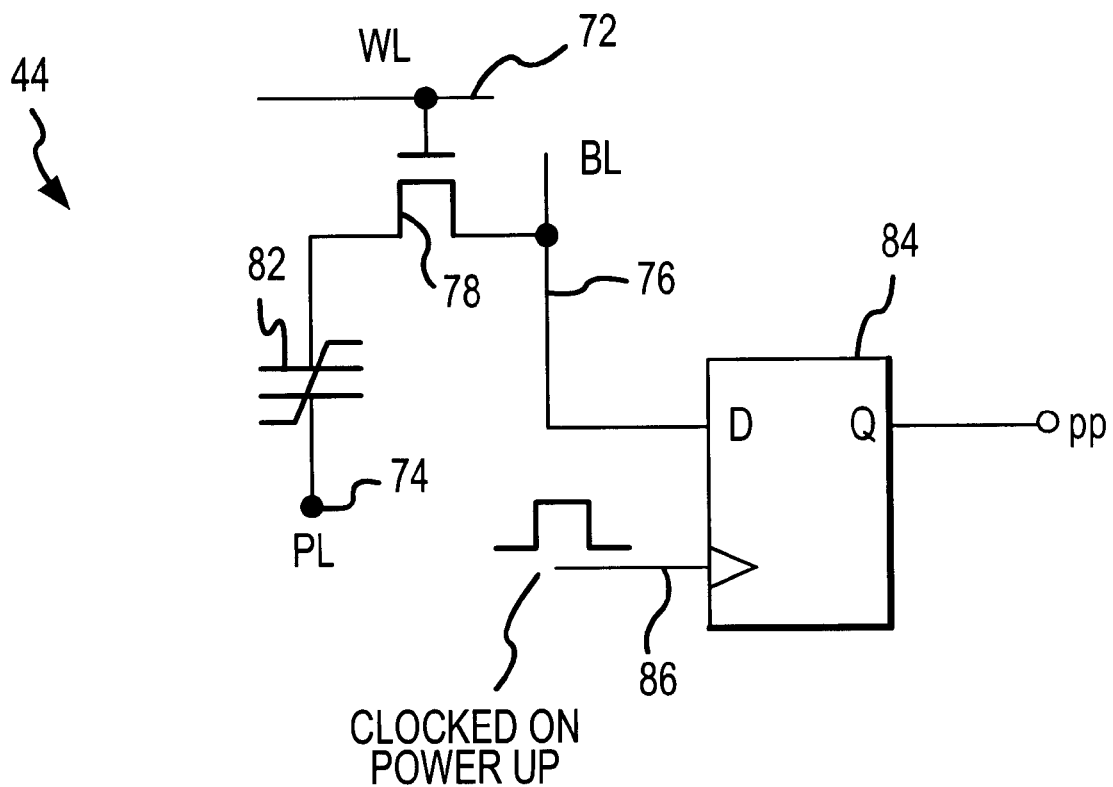
FIG. 4B is a schematic diagram that shows the non-volatile memory block of FIG. 4A in greater detail.

Referring momentarily to FIG. 4B, the non-volatile memory 44 is shown in greater detail. Non-volatile memory 44 includes, in one embodiment, a 1T-1C ferroelectric memory cell including a ferroelectric capacitor 82 having one terminal coupled to a plate line 74, and another terminal coupled to a source/drain of pass-gate transistor 78. The gate of transistor 78 is coupled to the word line 72, and the other source/drain of transistor 78 is coupled to the bit line 76. In addition to a ferroelectric memory cell including ferroelectric capacitor 82 and transistor 78, memory 44 includes a latch 84 having a D input coupled to bit line 76, and an input 86 for receiving a pulse that is clocked on powerup. A Q output provides the PP output signal coupled to control logic block 46.

Referring back to FIG. 4A, the CMOS output stage 52 has first, second, and third inputs at nodes 62, 64, and 58 for respectively receiving the /HIGH, /HIGH_P2, and LOW logic signals. The source of a first P-channel transistor MP1 is coupled to the VDD power supply and the gate forms the first input. The source of a second P-channel transistor MP2 is coupled to the drain of P-channel transistor MP1, the gate forms the second input, and the drain is coupled to output pad 54. The source of N-channel transistor MN1 is coupled to ground, the gate forms the third input, and the drain is coupled to output pad 54 The bulk node of P-channel transistor MP1 is coupled to the VDD power supply. The bulk node of P-channel transistor MP2 is coupled to the output pad 54. The bulk node of N-channel transistor MN1 is coupled to ground. The voltage on the second input 64 of output stage 52 is selectively set to the voltage designated VPAD on the output pad to prevent leakage current through the output stage as is described in further detail below.

Control logic circuit 46 includes a first input 42 for receiving an input signal designated IN, and a second input for receiving the circuit configuration data signal designated PP. Control logic circuit 46 also includes a first output 56 coupled to the first input of the output stage 52, and a second output 58 coupled to the third input of the output stage 52. The first output signal at node 56 is designated HIGH and the second output signal at node 58 is designated LOW.

Control logic circuit 46 is designed to provide the following logic function shown in logic table 66:

| IN | PP | /HIGH | /HIGH_P2 | LOW | OUTPUT |
|----|----|----|----|----|----|
| 0 | 1 | 1 | VPAD | 1 | GND |
| 1 | 1 | 0 | 0 | 0 | VDD |
| 0 | 0 | 1 | VPAD | 1 | GND |
| 1 | 0 | 1 | VPAD | 0 | HiZ |

When the configuration data signal PP is high, output stage 52 is placed into a push-pull output configuration. When the configuration data signal PP is low, output stage 52 is placed into a true open drain mode because no leakage current is possible through transistors MP1 and MP2 when /HIGH is set to VDD and /HIGH_P2 is set to the VPAD output pad voltage. Regardless of the output pad voltage, the voltage across the output stage (the gate-to-drain voltage of transistor MP2) is substantially equal to zero, and thus leakage current flow is prevented. The N-well of transistors MP1 or MP2 is not forward-biased, even if the VPAD voltage exceeds the VDD power supply voltage.

Level shifter circuit 48 has a power terminal coupled to the output pad 54, an input coupled to the first output 56 of the control logic circuit, and an output coupled to the second input 64 of output stage 52. Level shifter includes first and second P-channel transistors MPLS1 and MPLS2. The source of transistors MPLS1 and MPLS2 is coupled to the power terminal. The gates and drains of transistors MPLS1 and MPLS2 are cross-coupled, and the drain of the first P-channel transistor MPLS1 forms the output of the level shifter at node 64. First and second N-channel transistors MNLS1 and MNLS2 are coupled to the drains of P-channel transistors MPLS1 and MPLS2. The drain of N-channel transistor MNLS1 is coupled to the drain of transistor MPLS1, the gate forms the input of the level shifter at node 56, and the source is coupled to ground. The drain of N-channel transistor MNLS2 is coupled to the drain of transistor MPLS2, the gate for receives an inverted level shifter input signal at node 62 through inverter 11, and the source is coupled to ground. In operation, the function of level shifter 48 is to shift the input logic voltage level to an output logic level. A logic low input signal remains at ground for a logic low output signal, but a logic high input signal is shifted from the VDD power supply voltage to the VPAD voltage found on output pad 54.

Figure 5:
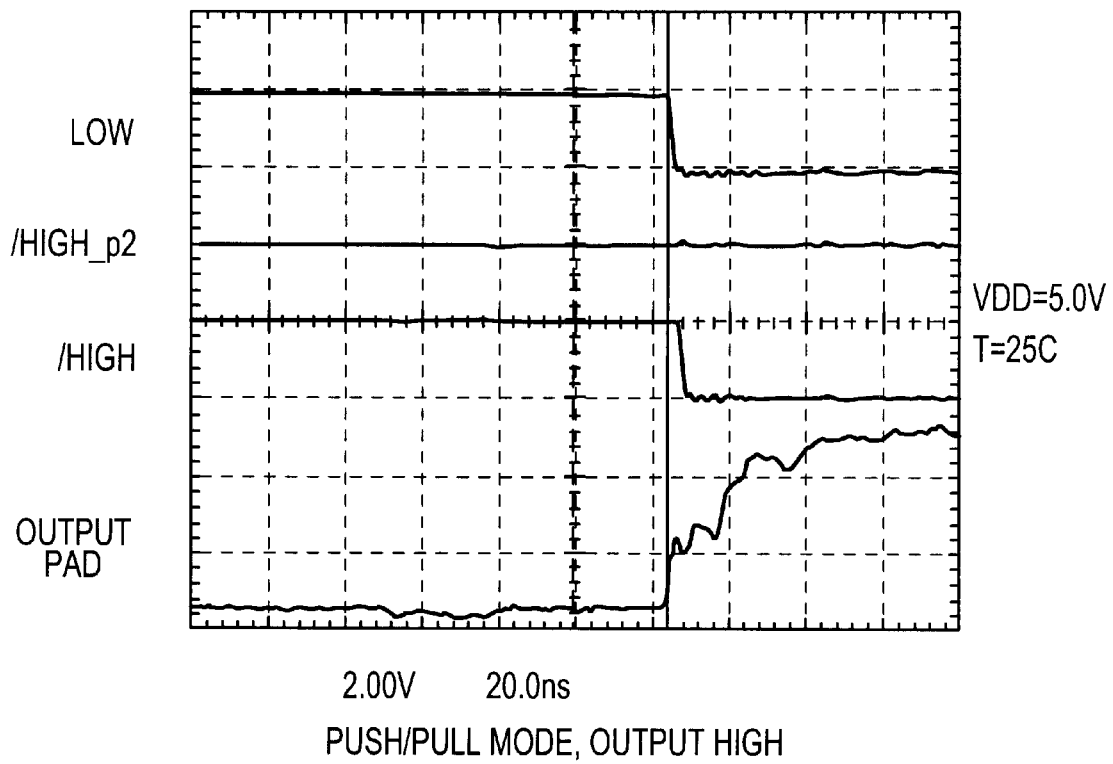
FIG. 5 is a plot of circuit signals for the configurable output driver circuit of the present invention configured in the push/pull mode, with the output pin driven high.

Referring now to FIG. 5, a plot is shown of the LOW, /HIGH_P2, HIGH and output pad signals for configurable output driver circuit 40 configured in the push/pull mode, with the output pin driven high.

Figure 6:
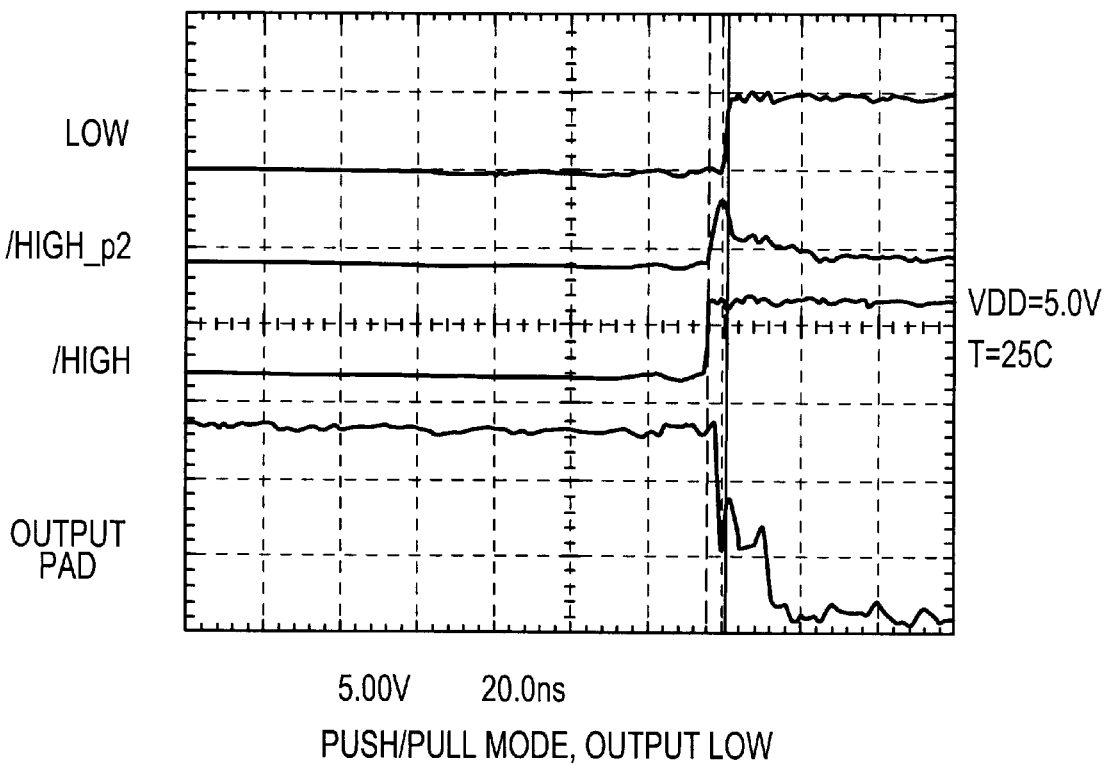
FIG. 6 is a plot of circuit signals for the configurable output driver circuit of the present invention configured in the push/pull mode, with the output pin driven low.

Referring now to FIG. 6 is a plot is shown of the LOW, /HIGH_P2, HIGH and output pad signals for the configurable output driver circuit 40 configured in the push/pull mode, with the output pin driven low.

Figure 7:
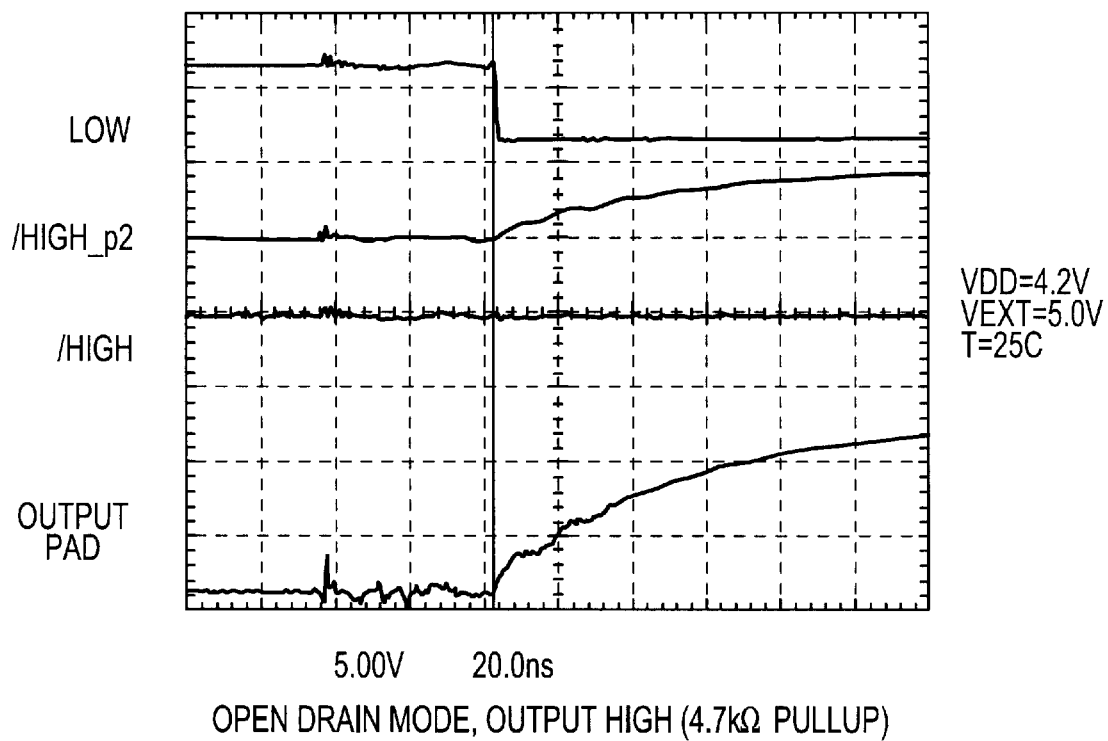
FIG. 7 is a plot of circuit signals for the configurable output driver circuit of the present invention configured in the open drain mode, with the output pin driven high.

Referring now to FIG. 7 is a plot is shown of the LOW, /HIGH_P2, HIGH and output pad signals for the configurable output driver circuit 40 configured in the open drain mode, with the output pin driven high.

Figure 8:
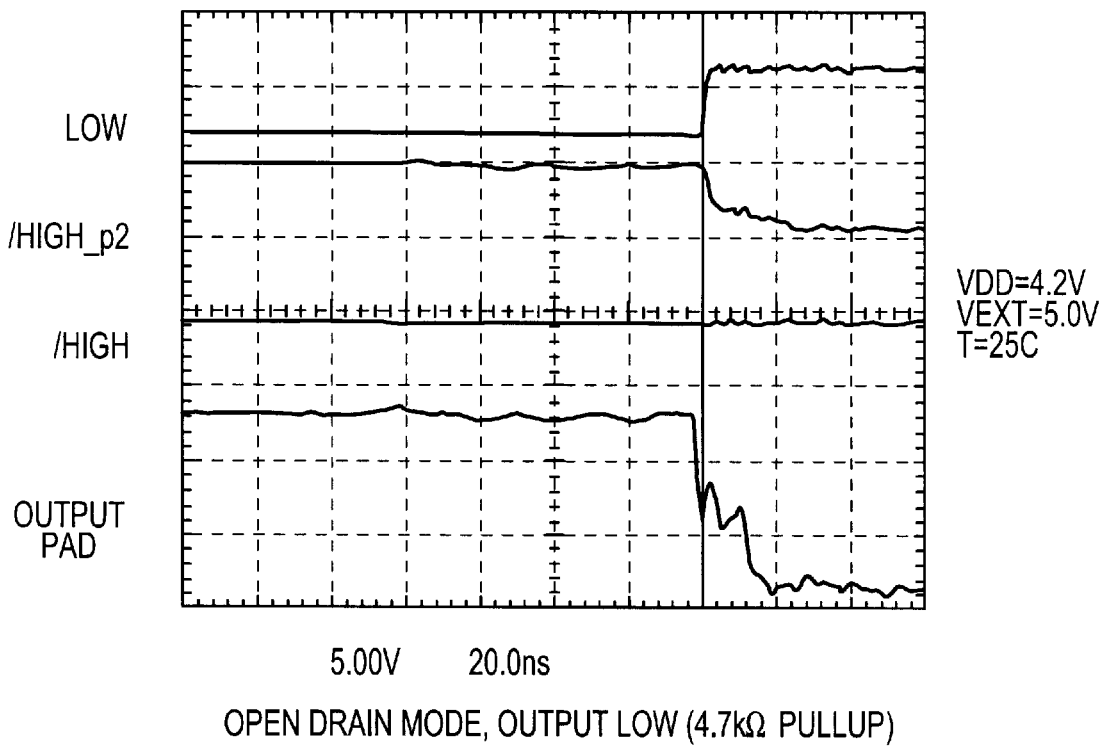
FIG. 8 is a plot of circuit signals for the configurable output driver circuit of the present invention configured in the open drain mode, with the output pin driven high.

Referring now to FIG. 8 is a plot is shown of the LOW, /HIGH_P2, HIGH and output pad signals for the configurable output driver circuit 40 configured in the open drain mode, with the output pin driven high.

Thus, an output driver circuit 40 and associated configuration method has been described in which user-selectable output circuit configuration data is persistently stored in non-volatile ferroelectric memory, the CMOS output stage is configured to provide either a push/pull output or a true open drain output in response to the configuration data; and the voltage across the CMOS output stage is controlled to substantially minimize leakage current flow through the output pad.

Having described and illustrated the principle of the invention in a preferred embodiment thereof, it is appreciated by those having skill in the art that the invention can be modified in arrangement and detail without departing from such principles. For example, other level shifters can be used, and the non-volatile memory could be flash, $E^2PROM$, EPROM, or any other electrically alterable non-volatile memory. I therefore claim all modifications and variations coming within the spirit and scope of the following claims.

We claim:

1. An output driver circuit comprising:

an output stage coupled to an output pad; and a non-volatile control logic circuit coupled to the output stage for configuring the output stage as either a push/pull output driver circuit or an open drain output driver.

2. An output circuit driver as in claim 1 in which the output stage comprises a CMOS output stage.

3. An output driver circuit as in claim 1 in which the output stage comprises:

a first P-channel transistor;

a second P-channel transistor serially coupled to the first P-channel transistor; and an N-channel transistor serially coupled to the second P-channel transistor.

4. An output driver circuit as in claim 1 in which the non-volatile control logic circuit comprises a ferroelectric random-access memory coupled to a control logic circuit, and wherein said non-volatile control logic circuit receives a data input.

5. An output driver circuit as in claim 1 in which the non-volatile control logic circuit comprises a 1T-1C ferroelectric memory cell coupled to a control logic circuit, and wherein said non-volatile control logic circuit receives a data input.

6. An output driver circuit as in claim 1 in which the non-volatile control logic circuit comprises a 2T-2C ferroelectric memory cell coupled to a control logic circuit, and wherein said non-volatile control logic circuit receives a data input.

7. An output driver circuit as in claim 1 in which the non-volatile control logic circuit comprises a flash memory coupled to a control logic circuit, and wherein said non-volatile control logic circuit receives a data input.

8. An output driver circuit as in claim 1 in which the non-volatile control logic circuit comprises an $E^2PROM$ memory coupled to a control logic circuit, and wherein said non-volatile control logic circuit receives a data input.

9. An output driver circuit as in claim 1 in which the non-volatile control logic circuit comprises an EPROM memory coupled to a control logic circuit, and wherein said non-volatile control logic circuit receives a data input.

10. An output driver circuit as in claim 1 in which the control logic circuit includes first and second outputs for driving the output stage.

11. An output driver circuit as in claim 1 in which the voltage on an input of the output stage is selectively set to the voltage on the output pad to prevent leakage current through the output stage.

12. An output driver circuit as in claim 1 further comprising means for preventing leakage current through the output stage when the output pad voltage exceeds the power supply voltage.

* * * * *